United States Patent [19]

Iranmanesh et al.

[11] Patent Number: 5,212,102

[45] Date of Patent: May 18, 1993

[54] METHOD OF MAKING POLYSILICON SCHOTTKY CLAMPED TRANSISTOR AND VERTICAL FUSE DEVICES

[75] Inventors: Ali A. Iranmanesh, Federal Way, Wash.; George E. Ganschow, Trabuco Canyon, Calif.

[73] Assignee: National Semiconductor Corporation, Santa Clara, Calif.

[21] Appl. No.: 894,403

[22] Filed: Jun. 5, 1992

Related U.S. Application Data

[62] Division of Ser. No. 571,346, Aug. 22, 1990, Pat. No. 5,144,404.

[51] Int. Cl.⁵ ............................. H01L 21/265
[52] U.S. Cl. ......................... 437/31; 257/528
[58] Field of Search ............................. 437/31

[56] References Cited

U.S. PATENT DOCUMENTS

| | | | |
|---|---|---|---|
| 3,191,151 | 6/1965 | Price | 340/166 |
| 3,648,125 | 3/1972 | Peltzer | 317/235 |
| 4,312,046 | 1/1982 | Taylor | 437/31 |
| 4,624,046 | 11/1986 | Shideler et al. | 29/576 B |
| 4,649,409 | 3/1987 | Roppongi et al. | 357/30 |
| 4,651,409 | 3/1987 | Ellsworth et al. | 437/31 |
| 4,705,599 | 11/1987 | Suda et al. | 156/653 |
| 4,705,968 | 11/1987 | Taki | 307/456 |
| 4,713,561 | 12/1987 | Yamada | 307/456 |
| 4,748,490 | 5/1988 | Hollingsworth | 357/51 |
| 4,754,172 | 6/1988 | Ovens et al. | 307/454 |
| 4,764,480 | 8/1988 | Vora | 437/54 |
| 4,851,715 | 7/1989 | Strong | 307/456 |
| 4,855,617 | 8/1989 | Ovens | 307/291 |
| 4,898,838 | 2/1990 | Morris et al. | 437/31 |
| 4,914,055 | 4/1990 | Gordon et al. | 437/203 |

FOREIGN PATENT DOCUMENTS

0084465 7/1983 European Pat. Off.
2369652 5/1978 France.

OTHER PUBLICATIONS

Grove, *Physics and Technology of Semiconductor Devices,* John Wiley & Sons, 1967, p. 113.
Brockhoff, "Electrically Shorted Semiconductor Junctions . . . Read Only Memory Elements" (date unknown) pp. 202-206.
Peltzer et al., "Isolation method shrinks bipolar cells for fast, dense memories," *Electronics* (Mar. 1, 1971) pp. 52-55.
Bursky, "Bipolar process fuses with new cell structures for fast, dense memories," *Elec. Design* (Oct. 14, 1982) pp. 35-36.

*Primary Examiner*—Olik Chaudhuri
*Assistant Examiner*—Long Pham
*Attorney, Agent, or Firm*—Townsend and Townsend Khourie and Crew

[57] ABSTRACT

An improved method for fabricating polysilicon Schottky clamped transistors and vertical fuse devices in the same semiconductor structure is disclosed. The resulting structure yields an improved Schottky clamped transistor and vertical fuse device. The improved Schottky transistor has a silicide rectifying contact between the base and collector of the transistor, the vertical fuse is provided with a direct contact between an aluminum contact metal and a polysilicon emitter contact.

11 Claims, 6 Drawing Sheets

METHOD OF MAKING POLYSILICON-SCHOTTKY CLAMPED TRANSISTOR AND VERTICAL FUSE DEVICES

This is a division of application Ser. No. 571,346 filed Aug. 22, 1990, now U.S. Pat. No. 5,144,404.

BACKGROUND OF THE INVENTION

This invention relates to a fabrication of Schottky transistors and vertical fuses in integrated circuits. In particular, the invention relates to a Schottky clamped transistor (SCT) having a first metal silicide on a portion of its contacts, with a second metal silicide displacing the first silicide on at least a portion of the base contact and extending to a collector window. The invention also provides a vertical fuse having a polycrystalline silicon ("polysilicon") contact to an emitter that improves switching speed and reduces side wall junction capacitance between the emitter and a base.

Numerous processes are now well known for the fabrication of bipolar transistor integrated circuits. Oxide isolated bipolar transistors integrated circuits are also well known, for example, as taught by Douglas Peltzer in U.S. Pat. No. 3,648,125, entitled "Method of Fabricating Integrated Circuits with Oxidized Isolation and the Resulting Structure," hereby expressly incorporated by reference for all purposes.

In addition to the above described "isoplanar" processing technology, the manufacture of both bipolar transistor devices and CMOS devices on a single die and incorporated into a single integrated circuit have been taught in U.S. Pat. No. 4,764,480, issued Aug. 16, 1988 to Vora, entitled "Process for Making High Performance CMOS and Bipolar Integrated Devices On One Substrate With Reduced Cell Size," hereby expressly incorporated by reference for all purposes. The described process uses polysilicon as an interconnect medium to form contacts to desired active areas.

In typical oxide isolated processes of the prior art, an N-type buried layer is diffused into a P-type silicon substrate. An N-type epitaxial layer is then deposited across the upper surface of the substrate. A suitable mask, typically silicon nitride on silicon dioxide, then is formed on top of the epitaxial layer, with regions of the silicon nitride being removed wherever field oxide regions are desired in the epitaxial layer. The epitaxial layer then is oxidized through the openings in the nitride layer to define these field oxide regions. If a recessed field oxide region is desired, a silicon etch is performed prior to oxidation.

In conventional bipolar process technology, the epitaxial layer is then implanted with a P-type dopant to define a base of the bipolar device, and then a heavily doped N-type emitter is diffused within the base region. If a transistor is desired, metal contacts are formed to the emitter, base and collector. The base contact is spaced apart from the emitter contact, while the collector contact relies upon a collector sink of like conductivity type to the buried layer, extending from a surface of the epitaxial layer to the buried layer. If a fuse is to be formed, the base contact is omitted. If a Schottky clamped transistor is to be formed, metal is used to connect a collector contact with the base contact.

In the past, applications have employed bipolar transistor devices as fuses in a programmable read only memory ("PROM") and in a programmable array logic ("PAL") device, as well as in other types of circuits. Vertical fuses are generally preferred to lateral fuses in these applications due to a smaller size and a greater packing density within an integrated circuit. A fusing action in typical prior art vertical fuses is activated by supplying a sufficiently high current or voltage pulse between an emitter and a collector of a bipolar transistor such that the fuse device is transformed from a floating base NPN transistor "0" to a collector-base diode "1". In a memory of a preferred embodiment, the ohmic contact transforms a bit represented by a transistor from a "0" to a "1" storage element.

Some prior art processes form a polysilicon contact for emitter and collector regions. In conventional processes, the polysilicon is established as a relatively flexible means of contacting and interconnecting various active regions of an integrated circuit. Generally, polysilicon is formed over an entire die, and areas are selectively doped to form contacts to the silicon below, or to form resistive elements, as known in the art.

In providing metal contacts to the polysilicon regions, a refractory metal is deposited over the entire die and reacted wherein a silicide is formed. Typically, titanium ("Ti") is used whereby $TiSi_2$ is formed. Other refractory metals may be used to produce a silicide, such as platinum silicide ("PtSi"), molybdenum silicide ("MoSi") and tantalum silicide ("TaSi"). Unreacted metal is removed and metallization processes are commenced. When incorporating vertical fuses on the same die as regular transistors, the metallization processes often include the formation of a barrier metal layer titanium-tungsten ("TiW") over the silicide on the transistors before a contact metal is deposited. The barrier metal prohibits the diffusion of contact metal atoms into the polysilicon for transistors, as happens with the contact metal in the vertical fuses. One problem in forming structures having transistors and fuses together is that of minimizing the process effects forming the barrier metal on the transistors without allowing the barrier metal to deposit on the fuses.

In addition to the use of vertical fuses, many integrated circuits benefit from the use of Schottky clamped transistors. These transistors are desirable for their controlled base current. The Schottky clamped transistor is a bipolar transistor using many of the same fabrication steps used to make a bipolar fuse device as above. However, the metal contact scheme necessary for the diode junction between the collector and base of the Schottky clamped transistor requires processing steps that are often incompatible with the fabrication of vertical fuses. For example, it is well known that PtSi is used as the Schottky metal contact in the Schottky clamped transistor, yet PtSi is undesirable in some fuse devices as it increases contact resistance. Furthermore, when Schottky devices and vertical fuses are fabricated on the same substrate, all the contact regions are opened before PtSi is deposited on the substrate surface. PtSi is only intended for the Schottky devices and an etch is used to remove any undesired PtSi from the remaining contacts, especially those on the vertical fuses. This etching is hard to precisely control, and because of such, the unintended overetching leads to shorting of the $V_{EB0}$ of both the vertical fuses as well as top-contacted NPN transistors, when included. Furthermore, when fabricating Schottky clamped transistors and fuse devices on the same substrate, the Schottky clamped transistor must be protected from the interconnect metal, such as aluminum, to protect it from the same type of fusing action needed for the fuse device.

Therefore, an improved method for fabricating Schottky transistors and vertical fuse devices as well as improved devices resulting therefrom are desired.

SUMMARY OF THE INVENTION

According to the present invention, an improved method for fabricating polysilicon Schottky clamped transistors and vertical fuse devices in the same semiconductor structure is disclosed. The resulting structure yields an improved Schottky clamped transistor and vertical fuse device. The improved Schottky transistor has a collector contact region and an emitter contact region of a first conductivity type, and a base contact region of a second conductivity type. The emitter and base contact regions have surfaces with a first refractory metal contact thereon. A collector window surface is adjacent a portion of the base contact region. A second refractory metal contacts the collector window surface and the adjacent base contact region. A first metal contacts at least a portion of the first refractory metal on the base contact region and a portion of the second refractory metal on the base contact region and collector window surface to prevent the migration of an aluminum contact metal to the underlying emitter region under the emitter contact region.

An improved vertical fuse is also disclosed. The vertical fuse has a collector contact region and an emitter region of a first conductivity type, and a base region of a second conductivity type located below the emitter region. The collector region further includes a contact with a top surface with the first refractory metal contacting a portion thereof. The emitter contact region includes a top surface portion that is free from both the first and the second refractory metals. In one embodiment, the first refractory metal is titanium silicide, the second refractory metal is platinum silicide, and the barrier metal is titanium tungsten. Contact metal directly contacts the top of the emitter contact.

In fabricating a semiconductor structure having a Schottky transistor and a vertical fuse device, the semiconductor structure is defined to have a first area for the transistor and the second area for the fuse. The Schottky transistor has a collector contact, an emitter contact and a base contact. The vertical fuse device has a collector contact and an emitter contact with a base region between the collector and emitter contacts. The collectors, emitters, and bases of the Schottky transistors and vertical fuses are fabricated. Then, after a silicide exclusion oxide layer is formed over the entire surface. A first refractory metal is deposited over the entire surface and then reacted over selected areas of open contacts to form a first reacted refractory metal layer. The desired areas overlying the semiconductor structure include the transistor base and base contact region, the transistor emitter contact region and at least a portion of the collector contact. Silicide is excluded from the base emitter and transistor Schottky window.

Thereafter, cap oxide is formed and a Schottky contact window is etched through the polysilicon layer. A second silicide is then deposited for formation of a Schottky contact between the base and collector of the Schottky transistor. Remaining contact vias are then etched in the cap oxide and a first contact metal layer is provided over selected areas of the first and second refractory metal layer and over the fuse collector region at the surface area. A second contact metal is then formed over the device, preferably in direct contact with the first emitter polysilicon contact.

DESCRIPTION OF THE PREFERRED EMBODIMENT

I. General

Figure 1:
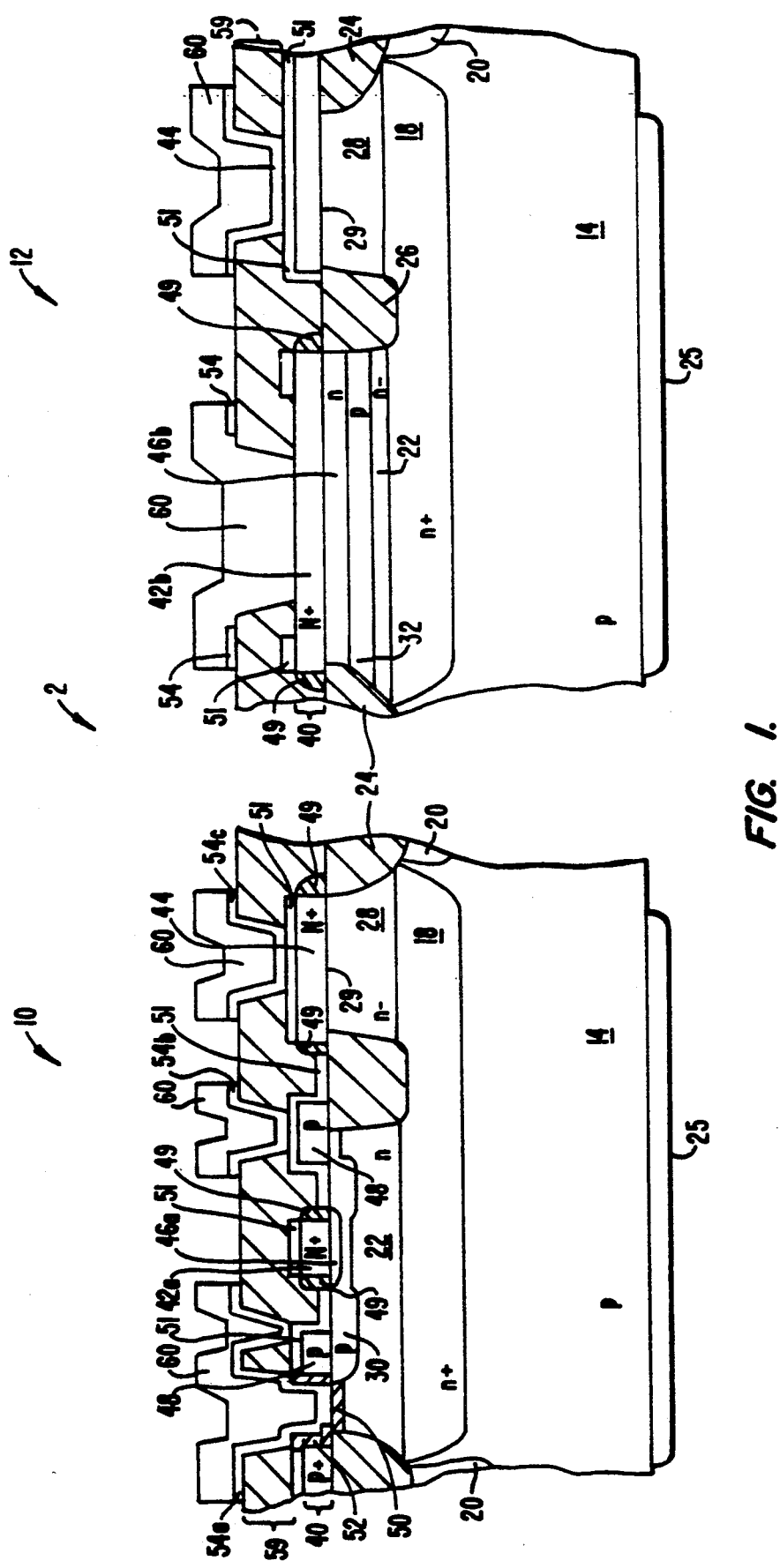
FIG. 1 is a cross-sectional view of a preferred embodiment of a Schottky clamped transistor and a vertical fuse according to one embodiment of the present invention.

FIG. 1 is a cross-sectional schematic illustration of a preferred embodiment for a Schottky clamp transistor 10 and a semiconductor fuse device 12. Transistor 10 and fuse device 12 includes a P conductivity type silicon substrate 14 doped with boron, in a preferred embodiment, to a predetermined resistivity. The resistivity value is about 30 to 50 ohms-centimeter ("$\Omega$-cm"). A buried layer 18, which acts as a low resistivity path between the collector and a collector contact, extends into substrate 14 and is doped with arsenic to a peak concentration of approximately $10^{18}$ to $10^{19}$/cm$^3$. A thin N-type epitaxial layer 22 of monocrystalline silicon overlies the upper surface of the substrate 14 and buried layer 18. Epitaxial layer 22 has an approximately thickness of about 1 $\mu$m.

A channel stop implant 20 prevents channel inversion at the silicon-dioxide/silicon interface in field oxide regions. A fully recessed field oxide region 24 is used to provide isolation for transistor 10 and fuse device 12. Field oxide region 24 surrounds an island 25 of epitaxial silicon 22, to thereby provide an electrically-isolated pocket within which active and/or passive devices may be formed. A second field oxide 26 separates a collector sink 28 from a remainder of each device. Collector sink 28 is heavily doped with a peak active chemical dopant concentration with an N-type dopant of about $10^{19}$ to $10^{20}$ atoms/cm$^3$ of phosphorus, to provide ohmic continuity to buried layer 18 from a collector sink contact 44.

A transistor base 30 is provided having a peak active chemical dopant concentration of a P-type dopant of about $5 \times 10^{17}$ to about $5 \times 10^{18}$ atoms/cm$^3$, forming a base collector junction at a depth of about 0.25 $\mu$m below the polysilicon-monocrystalline interface. A base 32 is provided in the fuse having an average active chemical dopant concentration of the same P-type dopant at about $10^{17}$ to $10^{18}$ atoms/cm$^3$. Fuse base 32 has a thickness of about 0.2 $\mu$m.

An intrinsic polysilicon layer 40 is formed over epitaxial layer 22. Select regions are implanted to desired active chemical dopant concentrations. Fuse 12 has a polysilicon emitter contact 42b with N-type dopant atoms, typically arsenic, having an active chemical dopant concentration of about $10^{20}$ atoms/cm$^3$. Fuse emitter contact 42b is preferably formed to completely cover fuse base region 32 to prevent future extrinsic base implant operations from modifying the fuse device. Transistor 10 has an emitter contact 42a that is limited to cover only a portion of base region 30. Similarly, polysilicon collector sink contacts 44 are provided overlying collector sinks 28.

An emitter 46b in fuse 12, which is formed below polysilicon contact 42b and which overlies fuse base 32, and is formed by diffusion of N-type dopant atoms from emitter contact 42b. Emitter 46a in transistor 10 is formed below polysilicon contact 42a by diffusion of N-type dopant atoms from emitter contact 42a.

A silicide layer 51, preferably formed by reacting a refractory metal, such as titanium to form titanium silicide ("TiSi$_2$") is provided over selected areas of polysilicon layer 40. A collector window region 50, adjacent base contact 48, is masked so that no silicide layer 51 is formed thereon.

Collector window region 50 and a portion of transistor base contact 48 are opened so that a second refractory metal can be deposited thereon. A second silicide layer 52, preferably formed by reacting a refractory metal, such as platinum silicide ("PtSi"), is provided in collector window region 50 of transistor 10.

PtSi 52 is deposited and reacted so that one end contacts the TiSi$_2$ on the top surface of base contact 48. PtSi 52 extends down the sidewall of base contact 48 adjacent collector window region 50. PtSi layer 52 continues on collector window region 50 and up the sidewall of a base contact 48, further connecting TiSi layer 51 thereon. This second refractory metal location is preferred because it forms a Schottky diode that clamps the voltage between the collector and base of Schottky clamped transistor 10 to a desired voltage, or serve as a Schottky diode, depending upon the circuit characteristics needed.

A barrier metal interconnect region 54 is preferably formed from titanium tungsten ("TiW") having a composition of, for example, about 10% Ti, 90% W. The region 54 is provided over the TiSi$_2$ 51 and PtSi 52 areas except those over fuse emitter contact 42b. The barrier metal layer is provided to prevent aluminum diffusion, which is required for fuse action in vertical fuse 12, into the Schottky contacts.

A first contact metal layer 60 preferably comprising a mixture of aluminum (Al), silicon (Si), and copper (Cu) is formed on oxide layer 59. The metal layer 60 (metal-1) is preferably comprised of Al/Si/Cu in the following relative amounts, by weight, Al—about 93.5% to 100%, 95.1% preferred; Si—about 0.5% to 1.5%, 0.9% preferred; and Cu—0% to 5%, 4% preferred. The metal layer 60 contacts TiW 54 directly over the transistor emitter contact 42a (in which the contact is not shown), a base contact adjacent the collector contact 44 and the collector. The metal layer 60 contacts silicide layer 51 directly over the fuse emitter contact 42b. Contact metal layer 60 over emitter contact region 42b forms a connection for a bit line of fuse device 12 in one embodiment.

In some embodiments, a second contact metal layer (not shown) of Al/Si/Cu is coupled to polysilicon region 44 to provide a contact for a word line of fuse device 12. Oxide (not shown) will provide isolation and protection for the structures of transistor 10 and fuse device 12. Fuse base 32 does not have an external connection and "floats" with respect to bit and word lines for the preferred embodiment.

II. Process Flow

FIGS. 2A-2J are cross sections of a semiconductor die undergoing a type of processing wherein a vertical fuse device embodying the present invention is simultaneously fabricated along side a Schottky clamped transistor (SCT) with both devices formed on the same die to form a Schottky clamped transistor and a vertical fuse as illustrated in FIG. 1.

Figure 2A:
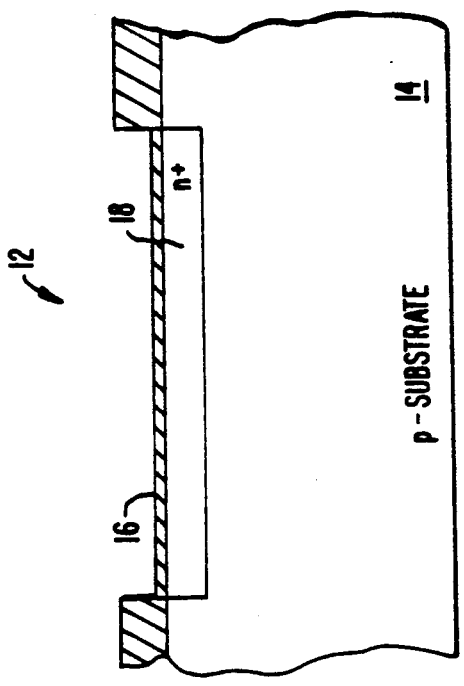
FIG. 2A through 2J are cross sections of a semiconductor die undergoing processing wherein the Schottky clamped transistor and vertical fuse are simultaneously fabricated alongside each other in the same die.
Figure 2A:
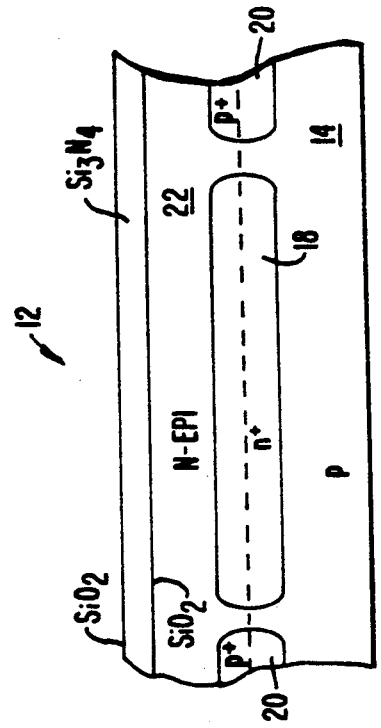

FIG. 2A is a cross section of a die 2 divided into two areas. A first area has been preselected for formation of a SCT 10 while a second area has been preselected for formation of a vertical fuse device 12. A P substrate 14 has been oxidized by techniques well known to those in the art. P substrate 12 is selectively masked, etched, and oxidized again to provide an implant protection oxide 16 and to define the buried layers of the transistor and fuse. N-type dopants are then implanted to form buried layer 18. Arsenic atoms are used to form buried layer 18. Similar implants (not shown) using a P dopant form channel stop regions 20.

Figure 2B:
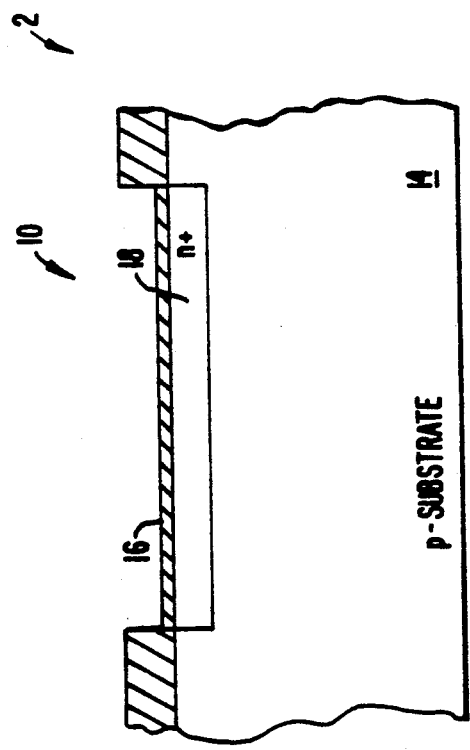
Figure 2B:
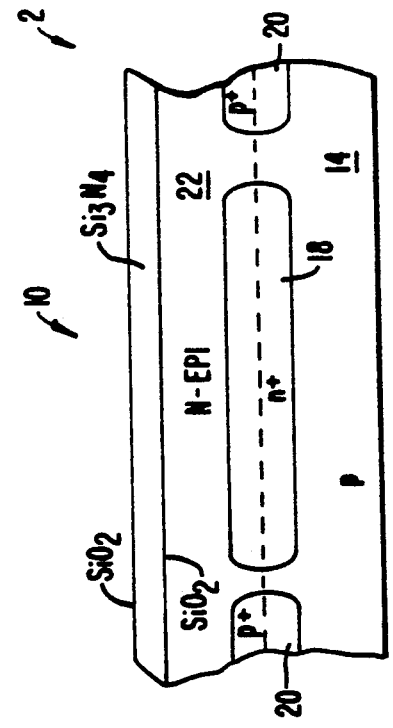

The field implant is then annealed and a phosphorus doped reduced pressure ("RP") epitaxial silicon layer is grown and oxidized as shown in FIG. 2B. The epitaxial layer 22 has an active chemical dopant concentration of about $10^{15}$ to about $10^{16}$ atoms/cm$^3$.

Figure 2C:
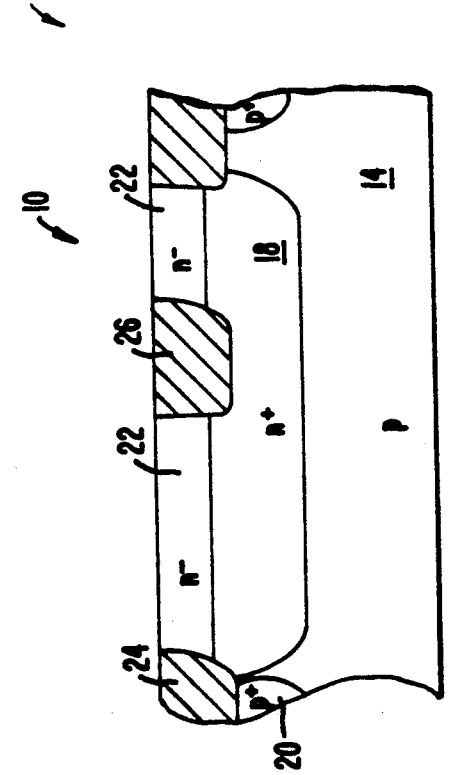
Figure 2C:
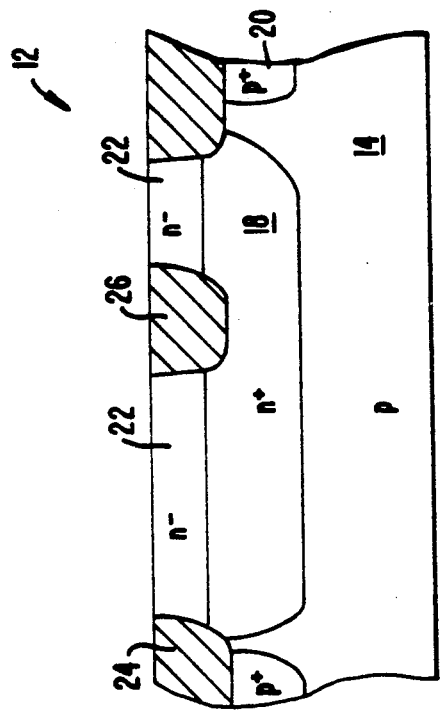

FIG. 2C is a cross section of die 2 wherein isolation islands have been formed and a bird-head planarization process has been performed. These isolation islands are formed by an oxide/nitride sandwich deposition, mask and KOH etch followed by high pressure oxidation (HI POX) procedures. A rectilinear region is formed by oxide 24 and divided into two areas by oxide 26.

Figure 2D:
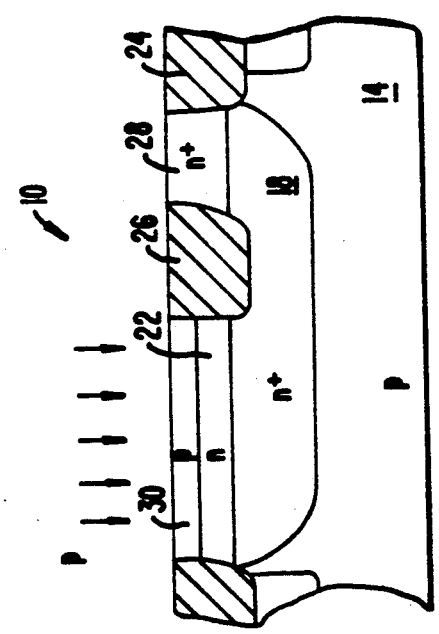
Figure 2D:
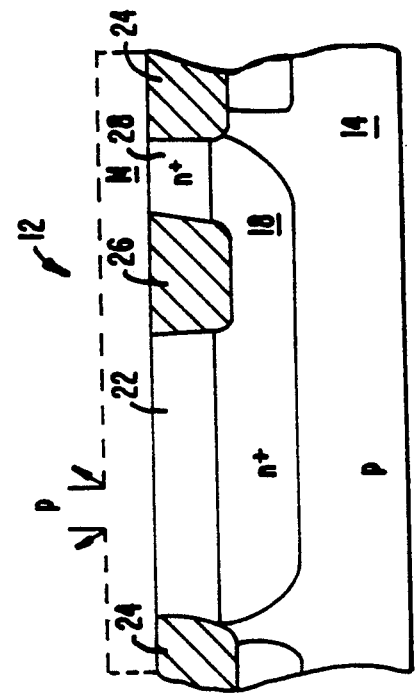

FIG. 2D is a cross section of die 2 after having a sink mask (not shown) applied and a sink implant step performed. The sink implant is annealed to provide sink regions 28 and is followed by an intrinsic unmasked base implant of SCT 10 while fuse device 12 is masked with a mask M. A base implant using BF$^{+2}$ provides SCT 10 with a base 30 having an active chemical dopant concentration of about $10^{17}$ to about $10^{18}$ atoms cm$^3$, with about $1 \times 10^{18}$ atoms cm$^3$ preferred. Typically, the base implant is performed by using an implant energy of between about 40 and 50 KeV, and a dose of between $2 \times 10^{13}$ and $3 \times 10^{13}$ BF$^{+2}$ ions/cm$^3$ with implant energies of about 45 KeV and doses of about $3 \times 10^{13}$ preferred. Base implant provides a $\beta$ for the to-be-formed transistor in the range of, for example, approximately 80 to about 120. Mask M protects the fuse device.

Figure 2E:
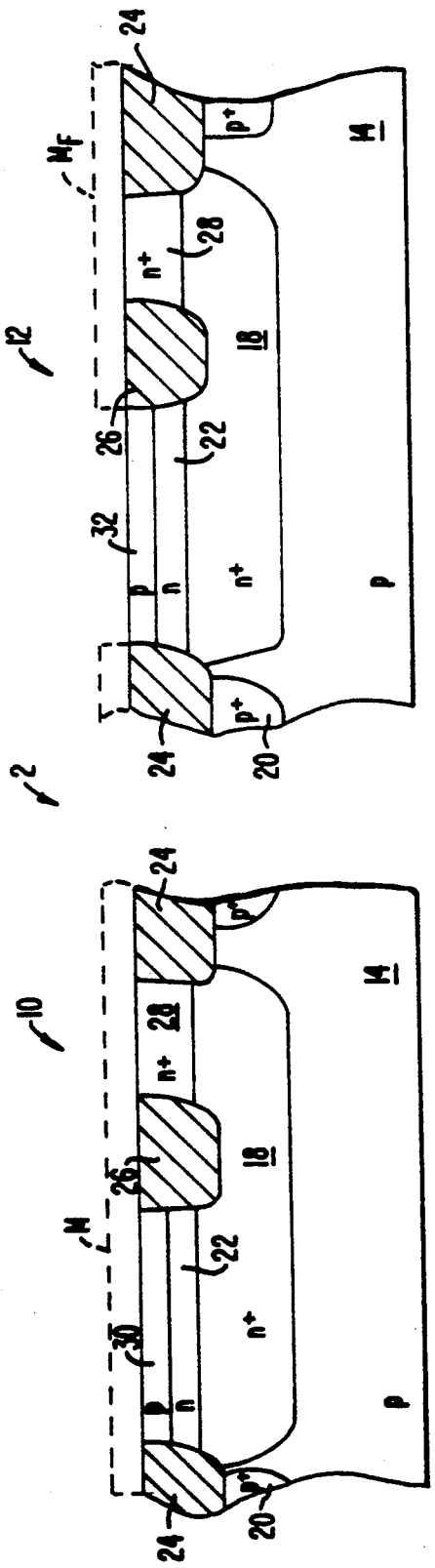

FIG. 2E is a cross section of die 2 having a mask overlying the sink of the fuse device and SCT 10. A separate base implant is optionally performed to provide base 32 with different parameters and characteristics than base 30 of SCT 10, if desired. The separate fuse base implant step is typically performed with BF$^{+2}$ ions using an implant energy of about 50 to 100 KeV and a dose of $1 \times 10^{13}$ to $5 \times 10^{13}$, with an implant energy and a dose of about 70 KeV and $2 \times 10^{13}$ preferred.

Figure 2F:
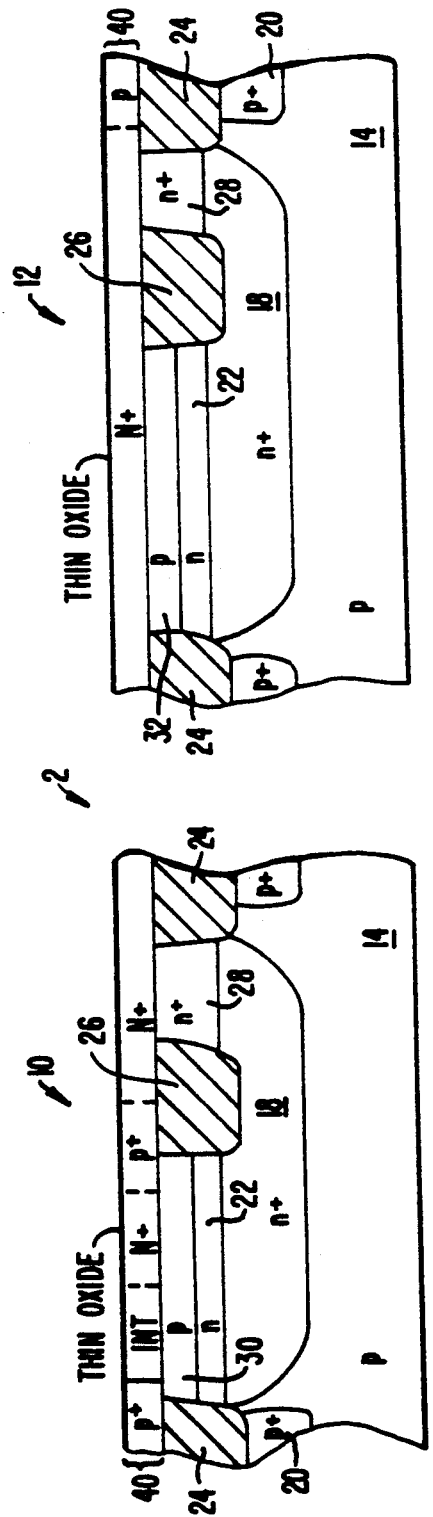

FIG. 2F is a cross section of die 2 having a layer 40 of polycrystalline silicon ("polysilicon") deposited over an entire surface of die 2. The polysilicon has a thickness in a range of about 4,000 to 5,000 Å, preferably 4,500 Å. Polysilicon layer 40 has a thin cap oxidation through which both P- and N-type impurities are implanted into polysilicon layer 40. Oversize masks are used to permit P+, P−, and N+ areas in polysilicon layer 40 to be formed where various elements, such as an emitter, base, and collector contact, and resistive elements (not shown) as desired, are to be formed for Schottky clamp transistor 10 and fuse device 12. Region 41 is not exposed in either the P+ or N+ implants and, accordingly, remains intrinsic.

Polysilicon layer 40 is formed to preferably have columnar grain boundaries having an average diameter of about 200 Å. It will be appreciated that polysilicon grain boundary size is a function of temperature and doping concentration. It is by these grain boundaries that mask transport of metal conductive metal atoms occurs. The importance of these grain boundaries is beyond the scope of the present invention and is discussed more fully in a separate patent application Ser. No. 07/570,131, "Polysilicon Vertical Fuse Device," filed Aug. 20, 1990 and assigned to the same assignee, herein incorporated for all purposes.

Figure 2G:
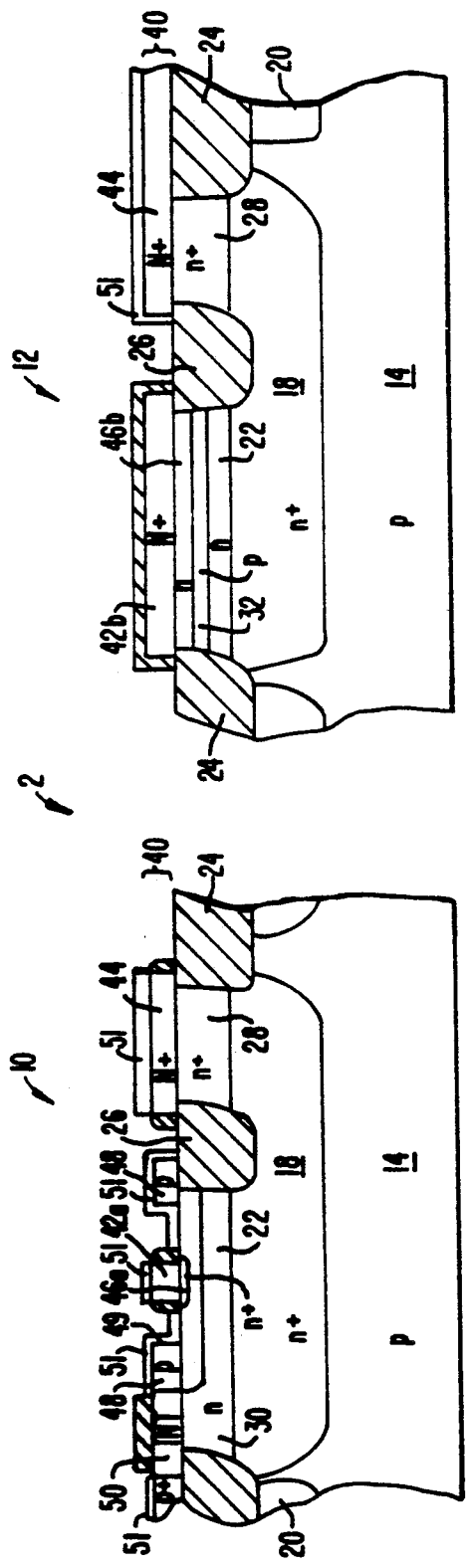

FIG. 2G is a cross section of die 2 after polysilicon layer 40 has been defined and etched. N+ polysilicon emitter contacts 42a, and 42b and N+ polysilicon collector sink contacts 44 are formed which will provide a contact to an emitter 46a and 46b and to collector sinks 28, respectively. Polysilicon emitter contact 42b is provided with a lateral dimension sufficient to completely overlap fuse base region 32. Schottky clamp transistor 10 is provided with a P+ base contact 48. Sidewall oxide is then formed in selected regions of the polysilicon contact in accord with the methods disclosed in U.S. Pat. No. 5,139,961 which is incorporated herein by referenced for all purposes.

Thereafter, an extrinsic base implant is performed. The extrinsic base implant forms more heavily doped regions in the base between the emitter and base contacts in the transistor. Polysilicon fuse emitter contact 42b prevents modification of fuse base 32 parameters during the extrinsic base implant operation, which is followed by a cap oxidation. Die 2 then has a silicide exclusion mask applied to protect collector window region 50 and at least a portion of the fuse emitter contact region 42b, followed by an anneal/oxidation step. This step drives some of the dopants from this polysilicon contact areas into the underlying epitaxial layer 22. This has the effect of creating an emitter 46b in fuse device 12 and an emitter 46a in Schottky clamp transistor 10.

After the anneal step, a thin oxide is removed and a first refractory metal, preferably titanium ("Ti"), is deposited over die 2. Other possible refractory metals are platinum, molybdenum and tantalum. The titanium deposition is followed by a first silicide reaction wherein TiSi$_2$ 51 is formed where titanium contacts polysilicon layer 40. Excess titanium is stripped, followed by a second silicide reaction (i.e., heating step) producing TiSi$_2$ 51 overlying the polysilicon contact areas except for the oxide sidewalls of polysilicon contacts, and in the locations of the silicide exclusion oxide.

TiSi$_2$ 51 covers the top surface of transistor base contact 48 and extends down one sidewall 49 adjacent to emitter contact 42a and ending at the base of the sidewall of emitter contact 42a. TiSi$_2$ 51 also covers the top surface of emitter contact 42a. The TiSi$_2$ then extends from the base of the other sidewall of emitter contact 42a to the other portion of base contact 48 covering both sidewalls and the top surface of the base contact and ending on oxide isolation 26. Transistor collector contact 44 also has TiSi$_2$ 51 on its top surface.

TiSi$_2$ is prevented from remaining on polysilicon over the collector window region 50 or the adjacent sidewall base contact 48 and is also prevented from remaining on fuse emitter contact 42b so that a subsequent metal contact can be placed directly on emitter contact 42b. Fuse collector contact 44 has TiSi$_2$ 51 on its top surface in preferred embodiments. Small portions of TiSi$_2$ remain on portions of the fuse emitter 42b to provide for mask.

Figure 2H:
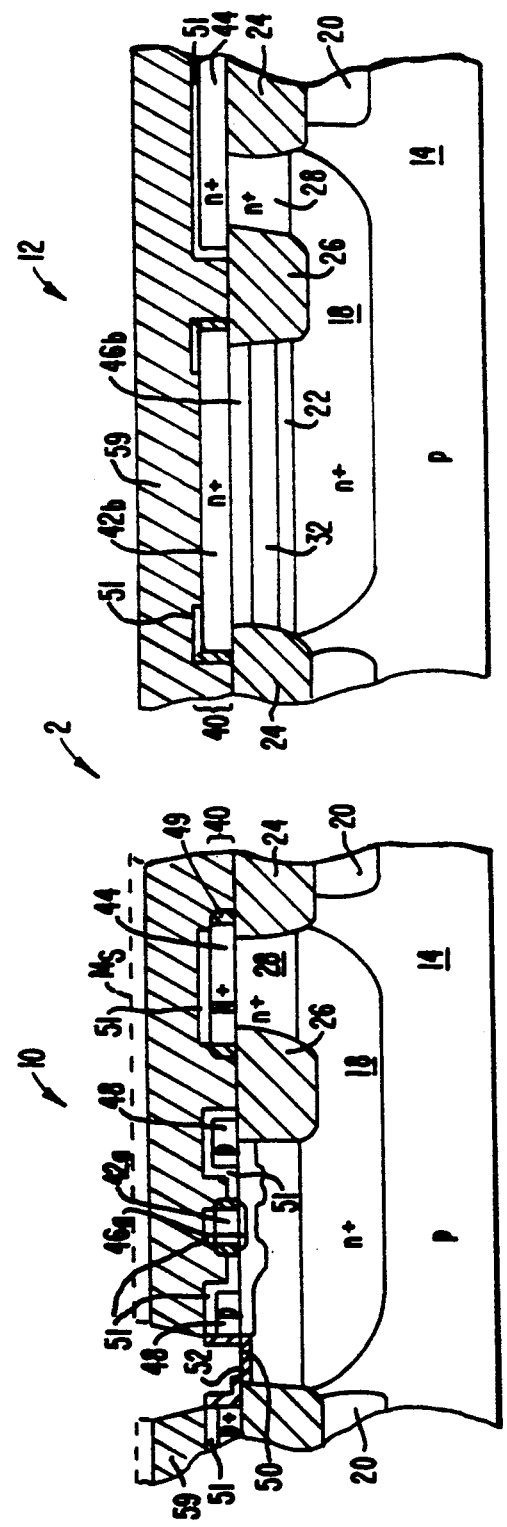

FIG. 2H is a cross section of die 2 having Schottky mask M$_s$ applied to die 2 after a chemical vapor deposition ("CVD") oxide 59, and planarization etch back and first CVD contact mask/etch have been performed. The oxide layer 59 is left intact over fuse 12 and all of the SCT, except the Schottky window region 50. Any of the known etching processes may be used for this purpose. A second refractory metal, preferably platinum ("Pt"), is deposited over die 2. The platinum deposition is followed by a first silicide reaction wherein PtSi is formed where platinum contacts polysilicon layer 40 and epilayer 30. Excess platinum is stripped, followed by a second silicide reaction producing PtSi layer 52 overlying the polysilicon contact area at collector window region 50. Only Schottky clamp transistor 10 has a platinum silicide layer 52 on collector window region 50.

PtSi layer 52 covers the surface of collector window region 50 and extends up both adjacent sidewalls until contacting the TiSi$_2$ 51 on each sidewall of the collector window. PtSi layer 52 is added on collector window region 50 to form a rectifying contact between the base and the collector of transistor 10. PtSi layer 52 contacts TiSi$_2$ 51 for improved clamping action.

Figure 2I:
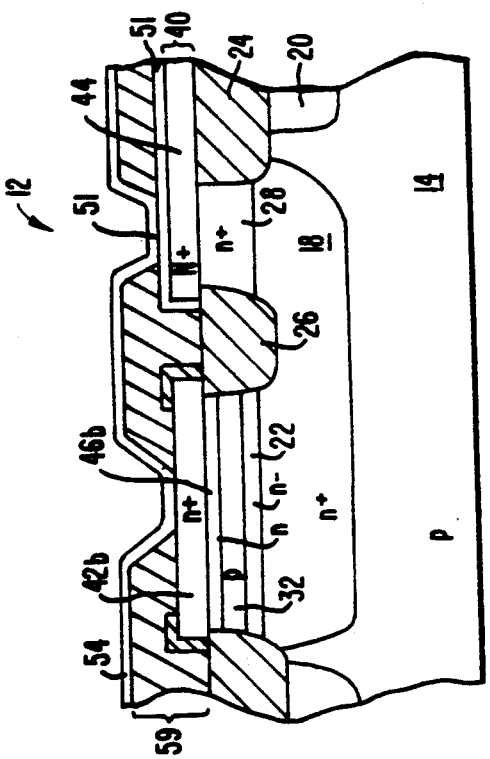

FIG. 2I is a cross section of die 2 after contact metallizations are performed. Contact vias are formed with an additional contact mask and etch to open contacts for the SCT base, SCT collector, and fuse collector and emitter. Oxide 59 is etched until TiSi$_2$ is exposed over base contact 48 and transistor collector contacts 44. A barrier metal 54 is then deposited over the entire surface of die 2. Barrier metal 54 typically comprises titanium tungsten ("TiW").

Figure 2J:
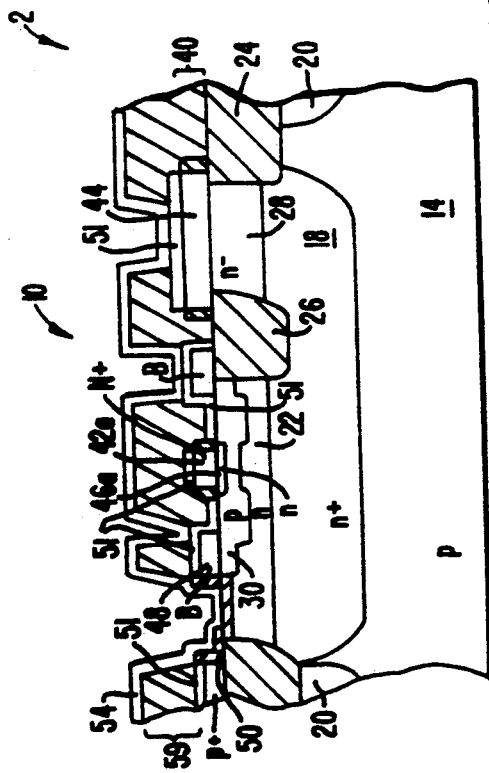

As shown in FIG. 2J, selected areas are then masked to permit barrier metal contacts to remain in selected areas after a removal process. On transistor 10, barrier metal contact 54a forms a contact on collector window region 50 and base contact 48. Barrier metal contact 54b also forms a contact on second portion of the base contact 48 adjacent collector contact 44. Barrier metal contact on 54c forms a contact on SCT collector contact 44, contacting oxide 59 and TiSi$_2$ 51.

Barrier metal is removed from fuse emitter contact 46b. The barrier metal is removed as it would block the migration of aluminum alloy atoms, provided during a subsequent contact step and needed in order to short fuse device 12. Excess TiW is removed by a standard dry etch process. An accompanying application, filed Aug. 20, 1990, U.S. Ser. No. 570,068, now U.S. Pat. No. 5,059,555, entitled "Method to Fabricate Vertical Fuse Devices and Schottky Diodes Using Thin Sacrificial Layer (TSL)," herein incorporated by reference for all purposes, highlights another method to perform the above steps.

As shown in FIG. 2J, contact metal 60 is then deposited, and separately masked and etched to form metal contacts. The deposited contact metal 60 is a mixture of aluminum, silicon, and copper. Contact metal 60 is deposited directly on the polysilicon emitter contact 42b over emitter 46b. A small portion of barrier metal contact 54 may remain between the peripheral edge of contact metal 60 and oxide 59 due to masking tolerances. Contact metal 60 directly contacts the polysilicon in fuse collector contact 44.

For connections to other active areas, barrier metal 54 (TiW) isolates the contact metal from polysilicon layer 40, affecting collector window region 50, base contact 48 and transistor collector contact 44 and, optionally, fuse collector contact 44. Finally, an additional dielectric CVD oxide (not shown) is formed and subsequently masked and etched to form subsequent layers of contact openings (not shown) to the SCT 10 and fuse device 12 on die 2.

Overall, the device characteristics for the Schottky clamped transistor having a minimum emitter area of $0.8 \times 1.6$ square microns are: current gain=90, $BV_{ceo}=7$ volts, $BV_{eco}=2.5$ volts and $F_t=14$ GHz. The device characteristics for the vertical fuse having an area of $1.6 \times 1.6$ microns square are: $BV_{ceo} > 8$ volts, $BV_{eco} > 3$ volts and power approximately 200 mWatts, with post programmed fuses exhibiting series resistance of less than 150 ohms and one nanoamp of leakage current.

The invention has now been described with reference to specific embodiments. Other embodiments will be apparent to those of ordinary skill in the art. It is therefore not intended that this invention be limited, except as indicated in the appended claims.

What is claimed is:

1. A process for fabricating a semiconductor structure on a substrate having a Schottky transistor in a first area and a vertical fuse in a second area, said transistor including a collector region, an emitter contact region, and a base contact region, said base contact region having a surface adjacent said collector contact region, said vertical fuse including a collector region, an emitter contact region, and a base region, said base region being between said emitter contact region and said collector contact region, the process comprising the steps of:
   forming a first refractory metal over at least a portion of said transistor base contact region and at least a portion of said collector region adjacent said base region, said first refractory metal forming a rectifying contact between a base and said collector of said transistor;
   forming a barrier metal over selected areas of said first reacted refractory metal layers, excluding said fuse emitter contact regions; and
   forming a contact metal over said selected areas of said first reacted refractory metal, said contact metal in direct contact with said fuse emitter contact.

2. The process of claim 1 before the step of reacting a first refractory metal, further including the step of forming a second refractory metal over selected areas to form a second reacted refractory metal layer, said selected areas contacting at least a portion of a transistor base contact region, at least a portion of a transistor collector contact region, said transistor emitter contact region, and said fuse collector contact region.

3. The process of claim 2 wherein said barrier contacts selected areas on said second refractory metal layers.

4. The process of claim 2 wherein said contact metal contacts selected areas of said second reacted refractory metal layers.

5. The process of claim 2, before wherein the step of forming a first refractory metal further comprises the steps of:
   masking said fuse device with an oxide layer;
   etching a contact via through said oxide and a polysilicon contact layer to said at least a portion of said collector region; and
   forming a silicide of said first refractory metal in contact with said base contact region and said collector region.

6. The process of claim 5 further comprising the step of etching contact vias in said oxide layer for base, emitter and collector contacts.

7. The process of claim 1 wherein said first refractory metal layer comprises platinum silicide, and said second refractory metal layer comprises titanium silicide.

8. The process of claim 1 wherein said barrier metal comprises titanium-tungsten.

9. A process for fabricating a semiconductor structure having a Schottky transistor in a first area and a vertical fuse device in a second area, the process comprising the steps of:
   providing a semiconductor substrate;
   implanting a first type of dopants into said substrate to form a collector region for said Schottky transistor and said vertical fuse device;
   growing an epitaxial layer over said substrate and said collector regions;
   implanting a second type of dopants into a base region of said epitaxial layer for said Schottky transistor, said transistor base region isolated from a sink region coupling a part of a surface of said epitaxial layer to said transistor collector region;
   implanting said second type of dopants into a base region of said epitaxial layer for said vertical fuse device, said fuse base region isolated from a sink region coupling a part of a surface of said epitaxial layer to said fuse collector region;
   providing said first type dopants in a portion of said polycrystalline layer overlying said base regions and second type dopants in said polycrystalline layer overlying emitter and collector regions, while leaving said polycrystalline layer intrinsic over a collector window region;
   treating said semiconductor structure to promote a migration of said first dopant types across an interface from said polycrystalline layer into said epitaxial layer to an emitter region overlying said transistor and fuse base regions;
   forming a first refractory metal over selected areas of said polycrystalline layer to form a first reacted refractory metal layer, said selected areas overlying said transistor base region and a portion of said transistor emitter region;
   forming a second refractory metal silicide in contact with said collector window region and a base contact region, said second refractory metal forming a rectifying contact between said collector and said base;
   forming a barrier metal over selected areas of said first and second reacted refractory metal layers, except an emitter contact of said fuse; and
   forming a contact metal over said barrier metal in direct contact with said emitter contact.

10. The process of claim 9 wherein said polycrystalline layer comprises silicon, said first reacted refractory metal comprises titanium silicide, and said second reacted refractory metal layer comprises platinum silicide.

11. The process of claim 9 wherein said barrier metal comprises titanium-tungsten.

* * * * *